(12) United States Patent
Taguchi et al.

(10) Patent No.: US 12,272,590 B2
(45) Date of Patent: Apr. 8, 2025

(54) SUBSTRATE PROCESSING APPARATUS

(71) Applicant: Tokyo Electron Limited, Tokyo (JP)

(72) Inventors: Junnosuke Taguchi, Iwate (JP);
Yasutomo Kimura, Iwate (JP); Hisashi Takahashi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 310 days.

(21) Appl. No.: 17/820,076

(22) Filed: Aug. 16, 2022

(65) Prior Publication Data
US 2023/0061423 A1 Mar. 2, 2023

(30) Foreign Application Priority Data

Sep. 2, 2021 (JP) .................................. 2021-143522

(51) Int. Cl.
H01L 21/687 (2006.01)
C23C 14/50 (2006.01)

(52) U.S. Cl.
CPC ...... H01L 21/68742 (2013.01); C23C 14/505 (2013.01); H01L 21/68764 (2013.01); H01L 21/68785 (2013.01)

(58) Field of Classification Search
CPC .................... H01L 21/68742; C23C 14/505
See application file for complete search history.

(56) References Cited

U.S. PATENT DOCUMENTS

| 2017/0032997 | A1* | 2/2017 | Willwerth | H01L 21/6875 |
| 2019/0067076 | A1* | 2/2019 | Zvokelj | F16K 3/02 |
| 2019/0080955 | A1* | 3/2019 | Lee | G03F 7/70691 |
| 2020/0075390 | A1* | 3/2020 | Dür | H01L 21/68742 |
| 2020/0157678 | A1* | 5/2020 | Schaller | C23C 16/4586 |
| 2021/0005505 | A1* | 1/2021 | Wagatsuma | H01L 21/67098 |
| 2021/0134651 | A1* | 5/2021 | D?nser | H01L 21/68742 |
| 2022/0020629 | A1* | 1/2022 | Eschenmoser | G01K 13/00 |
| 2022/0044957 | A1* | 2/2022 | D?R | H01L 21/68742 |
| 2022/0076987 | A1* | 3/2022 | Eschenmoser | H01L 21/68742 |
| 2022/0282369 | A1* | 9/2022 | Yanagisawa | H01L 21/68742 |
| 2022/0293451 | A1* | 9/2022 | Sulyman | H01L 21/6831 |
| 2022/0293452 | A1* | 9/2022 | Sulyman | H01L 21/68742 |
| 2022/0399217 | A1* | 12/2022 | Marzinotto | H01L 21/67259 |
| 2022/0415702 | A1* | 12/2022 | Drewery | H01J 37/32623 |
| 2023/0061423 | A1* | 3/2023 | Taguchi | H01L 21/67103 |
| 2023/0193464 | A1* | 6/2023 | Kuribayashi | C23C 16/45551 118/708 |

FOREIGN PATENT DOCUMENTS

JP 2021-110023 8/2021

* cited by examiner

Primary Examiner — Kaitlin S Joerger
(74) Attorney, Agent, or Firm — IPUSA, PLLC

(57) ABSTRACT

A substrate processing apparatus includes a processing chamber configured to process a substrate by using a processing gas; a rotary table that is rotatably provided in the processing chamber; a stage on which the substrate is to be placed and that is configured to be rotatable relative to the rotary table at a position spaced apart from a center of rotation of the rotary table, a lift pin configured to be displaced relative to the stage to raise and lower the substrate; and a housing configured to house the lift pin when the lift pin is not unexposed from the stage. The lift pin and the housing have a closing structure that closes a gap between the lift pin and the housing.

8 Claims, 9 Drawing Sheets

SUBSTRATE PROCESSING APPARATUS

CROSS-REFERENCE TO RELATED APPLICATIONS

This application is based on and claims priority to Japanese Patent Application No. 2021-143522, filed on Sep. 2, 2021, the entire contents of which are incorporated herein by reference.

BACKGROUND OF THE INVENTION

1. Field of the Invention

The disclosure herein relates to a substrate processing apparatus.

2. Description of the Related Art

A substrate processing apparatus including a rotary table that is rotatable in a processing chamber and a stage that is rotatable relative to the rotary table and on which a substrate is placed is known (see Patent Document 1). For example, the substrate processing apparatus performs a process for depositing a film on the substrate placed on the stage by supplying a processing gas into the processing chamber.

Such a substrate processing apparatus includes a plurality of lift pins configured to be raised and lowered relative to the stage, such that the substrate can be transferred between the stage and a conveying apparatus that conveys the substrate. That is, the substrate processing apparatus receives the substrate by raising the lift pins above the stage, and places the substrate on the stage by lowering the lift pins.

RELATED-ART DOCUMENTS

Patent Documents

Patent Document 1: Japanese Laid-open Patent Application Publication No. 2021-110023

SUMMARY OF THE INVENTION

According to an embodiment of the present disclosure, a substrate processing apparatus includes a processing chamber configured to process a substrate by using a processing gas; a rotary table that is rotatably provided in the processing chamber; a stage on which the substrate is to be placed and that is configured to be rotatable relative to the rotary table at a position spaced apart from a center of rotation of the rotary table, a lift pin configured to be displaced relative to the stage to raise and lower the substrate; and a housing configured to house the lift pin when the lift pin is not unexposed from the stage. The lift pin and the housing have a closing structure that closes a gap between the lift pin and the housing.

BRIEF DESCRIPTION OF THE DRAWINGS

Other objects and further features of the present invention will be apparent from the following detailed description when read in conjunction with the accompanying drawings, in which.

DESCRIPTION OF THE EMBODIMENTS

Figure 1:
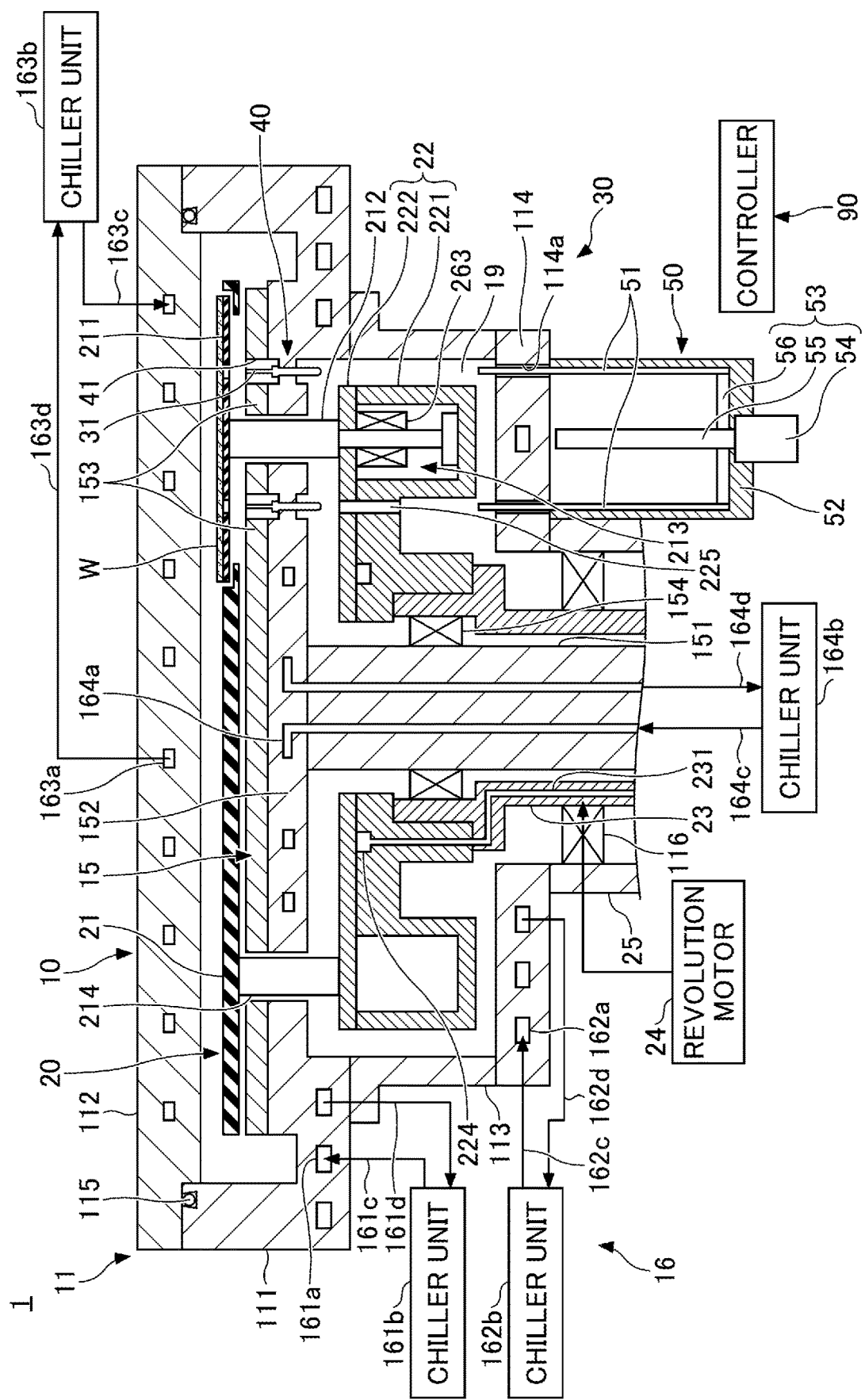
FIG. 1 is a cross-sectional view illustrating an example configuration of a film deposition apparatus according to an embodiment.

In the following, embodiments of the present disclosure will be described with reference to the accompanying drawings. In the drawings, the same elements are denoted by the same reference numerals and the description thereof will not be repeated.

[Substrate Processing Apparatus]

Figure 2:
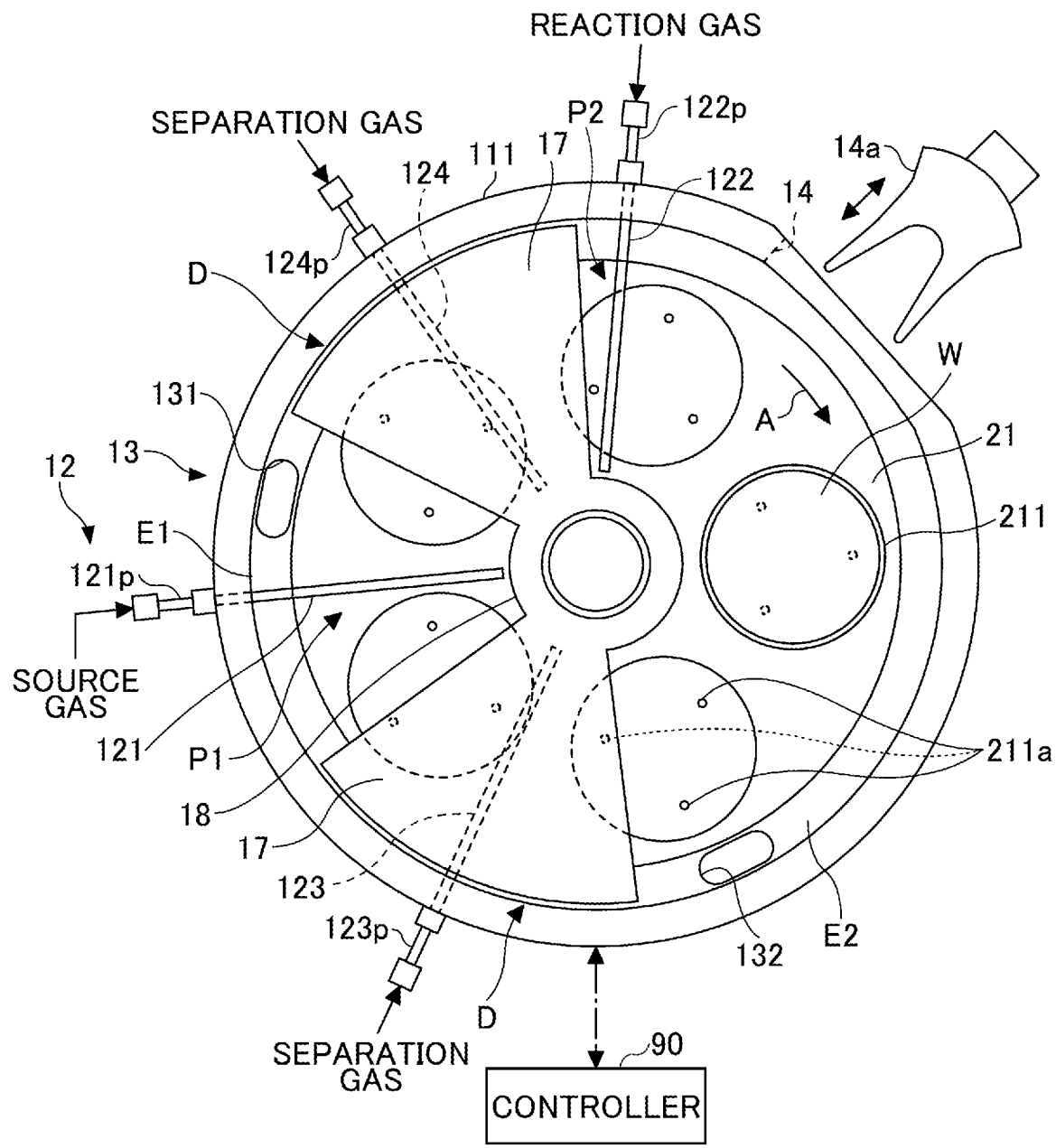
FIG. 2 is a plan view illustrating a configuration in a vacuum chamber of the film deposition apparatus of FIG. 1.
Figure 3:
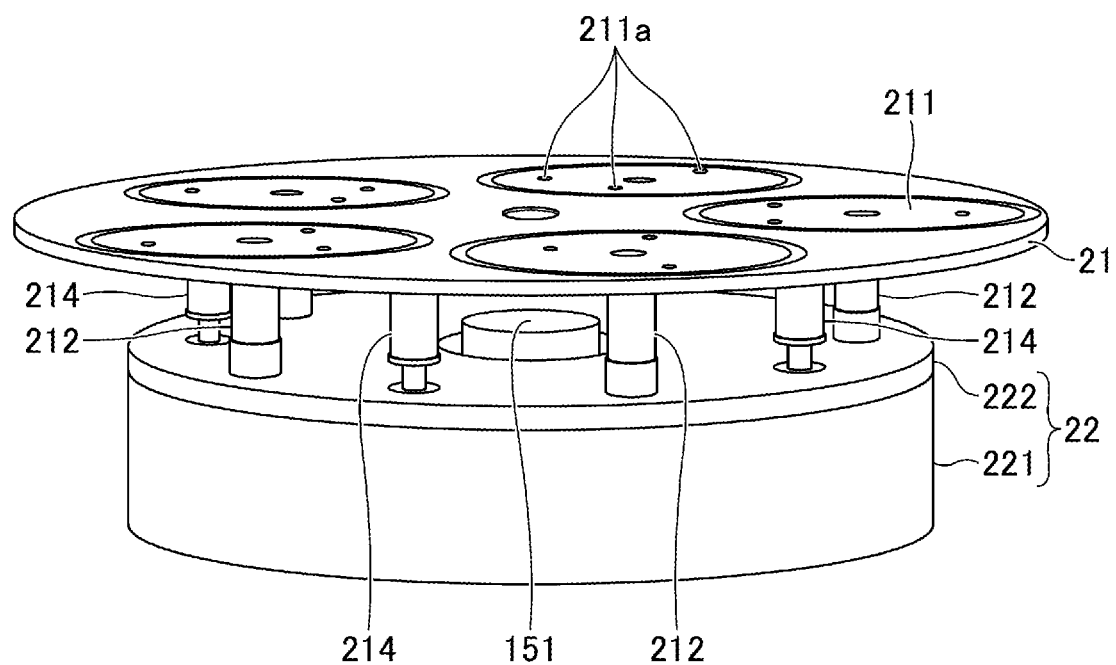
FIG. 3 is a perspective view illustrating a configuration of a rotary table and a stage of the film deposition apparatus of FIG. 1.

With reference to FIG. 1 through FIG. 3, a film deposition apparatus 1, which is an example of a substrate processing apparatus, configured to form a film on a substrate W will be described. FIG. 1 is a cross-sectional view illustrating an example configuration of the film deposition apparatus 1 according to an embodiment. FIG. 2 is a plan view illustrating a configuration in a vacuum chamber 11 of the film deposition apparatus 1 of FIG. 1. In FIG. 2, a top plate is not depicted for convenience of description. FIG. 3 is a perspective view illustrating a configuration of a rotary table 21 and a stage 211 of the film deposition apparatus 1 of FIG. 1.

The film deposition apparatus 1 includes a processor 10, a rotation driving device 20, a lift pin mechanism 30, and a controller 90.

The processor 10 performs a film deposition process for forming a film on a substrate W. The processor 10 includes the vacuum chamber 11, a gas introduction port 12, a gas exhaust port 13, a transfer port 14, a heater 15, and a cooler 16.

The vacuum chamber 11 is a processing chamber that can reduce air pressure inside the vacuum chamber 11. The vacuum chamber 11 has a flat and substantially circular shape in a plan view, and can accommodate a plurality of substrates W in the vacuum chamber 11. The substrates W may be, for example, semiconductor wafers. The vacuum chamber 11 includes a body 111, a top plate 112, a side wall body 113, and a bottom plate 114 (see FIG. 1). The body 111 has a cylindrical shape. The top plate 112 is removably disposed on the top surface of the body 111. The body 111 and the top plate 112 are air-tightly bonded by a seal 116. The side wall body 113 has a cylindrical shape and is air-tightly connected to the bottom surface of the body 111. The bottom plate 114 is air-tightly connected to the bottom surface of the side wall body 113.

The gas introduction port 12 includes a source gas nozzle 121, a reaction gas nozzle 122, and separation gas nozzles 123 and 124 (see FIG. 2). The source gas nozzle 121, the reaction gas nozzle 122, and the separation gas nozzles 123 and 124 are disposed to be spaced apart from each other in the circumferential direction of the vacuum chamber 11 (a direction indicated by an arrow A in FIG. 2) over the rotary table 21 as will be described later. In the illustrated example, the separation gas nozzle 123, the source gas nozzle 121, the separation gas nozzle 124, and the reaction gas nozzle 122 are arranged clockwise (in the rotational direction of the rotary table 21) from the transfer port 14 in this order. The source gas nozzle 121, the reaction gas nozzle 122, and the separation gas nozzles 123 and 124 respectively include gas introduction ports 121*p*, 122*p*, 123*p*, and 124*p* for introducing various gases at the base ends thereof (see FIG. 2). The gas introduction ports 121*p*, 122*p*, 123*p*, and 124*p* are fixed to the side wall of the body 111, and extend to the outside of the body 111. The source gas nozzle 121, the reaction gas nozzle 122, and the separation gas nozzles 123 and 124 are inserted from the side wall of the body 111 into the vacuum chamber 11, and extend radially inward into the body 111. The source gas nozzle 121, the reaction gas nozzle 122, and the separation gas nozzles 123 and 124 are made of, for example, quartz, and are disposed parallel to the rotary table 21.

The source gas nozzle 121 is connected to a source of a source gas (not illustrated) through a pipe, a flow controller, and the like (not illustrated). For example, a silicon-containing gas and a metal-containing gas may be used as the source gas. In the source gas nozzle 121, a plurality of exhaust holes (not illustrated) that open toward the rotary table 21 are arrayed to be spaced apart from each other along the axial direction of the source gas nozzle 121. A region under the source gas nozzle 121 is a source gas adsorption region P1 for adsorbing the source gas on a substrate W.

The reaction gas nozzle 122 is connected to a source of a reaction gas (not illustrated) through a pipe, a flow controller, and the like (not illustrated). For example, an oxidizing gas or a nitriding gas may be used as the reaction gas. In the reaction gas nozzle 122, a plurality of exhaust holes (not illustrated) that open toward the rotary table 21 are arrayed to be spaced from each other along the axial direction of the reaction gas nozzle 122. A region under the reaction gas nozzle 122 is a reaction gas supply region P2 in which the source gas adsorbed on the substrate W in the source gas adsorption region P1 is oxidized or nitrided. In the present embodiment, a processing gas for processing the substrate W includes the above-described source gas and the reaction gas.

The separation gas nozzles 123 and 124 are both connected to a source of a separation gas (not illustrated) through a pipe, a flow control valve, and the like (not illustrated). For example, an inert gas such as argon (Ar) gas, nitrogen ($N_2$) gas, or the like may be used as the separation gas. In the separation gas nozzles 123 and 124, a plurality of exhaust holes (not illustrated) that open toward the rotary table 21 are arrayed to be spaced apart from each other along the axial direction of the separation gas nozzles 123 and 124.

Further, as illustrated in FIG. 2, two protruding portions 17 are provided in the vacuum chamber 11. The protruding portions 17 are attached to the back surface of the top plate 112 to protrude toward the rotary table 21, so that the protruding portions 17 form separation regions D together with the separation gas nozzles 123 and 124. In a plan view, the protruding portions 17 have a circular sector shape whose top is cut in an arc shape so that an inner arc is connected to a protrusion 18 and an outer arc is disposed along the inner wall of the vacuum chamber 11.

The gas exhaust port 13 includes a first exhaust port 131 and a second exhaust port 132 (see FIG. 2). The first exhaust port 131 is formed on the bottom of a first exhaust region E1 communicating with the source gas adsorption region P1. The second exhaust port 132 is formed on a bottom of a second exhaust region E2 communicating with the reaction gas supply region P2. The first exhaust port 131 and the second exhaust port 132 are connected to an exhaust device (not illustrated) through an exhaust pipe (not illustrated).

The transfer port 14 is provided on the side wall of the body 111 (see FIG. 2). In the transfer port 14, the substrate W is transferred between the rotary table 21 in the vacuum chamber 11 and a transfer arm 14*a* outside the vacuum chamber 11. The transfer port 14 is opened and closed by a gate valve (not illustrated).

The heater 15 includes a fixing shaft 151, a heater support 152, and a heater 153 (see FIG. 1).

The fixing shaft 151 has a cylindrical shape having a central axis at the center of the vacuum chamber 11. The fixing shaft 151 is provided inside a rotary shaft 23 of the rotation driving device 20, which will be described later, so as to pass through the bottom plate 114 of the vacuum chamber 11.

The heater support 152 is fixed to the top of the fixing shaft 151 and has a disc shape. The heater support 152 supports the heater 153.

The heater 153 is provided on the upper surface of the heater support 152. The heater 153 may be provided on the body 111 in addition to the upper surface of the heater support 152. The heater 153 generates heat when power is supplied from a power source (not illustrated) to heat the substrate W. Further, a shielding plate 156 (see FIG. 4) is provide on the upper surface of the heater 153. The shielding plate 156 is disposed above the body 111 or the heater support 152 so as to face the body 111 or the heater support 152, and prevents the heater 153 from being exposed to the processing gas.

The cooler 16 includes fluid flow paths 161*a*, 162*a*, 163*a*, and 164*a*, chiller units 161*b*, 162*b*, 163*b*, and 164*b*, inlet pipes 161*c*, 162*c*, 163*c*, and 164*c*, and outlet pipes 161*d*, 162*d*, 163*d*, and 164*d*. The fluid flow paths 161*a*, 162*a*, 163*a*, and 164*a* are respectively formed inside the body 111, the top plate 112, the bottom plate 114, and the heater support 152. The chiller units 161*b*, 162*b*, 163*b*, and 164*b* output temperature-controlled fluids. The temperature-controlled fluids output from the chiller units 161*b*, 162*b*, 163*b*, and 164*b* flow through the inlet pipes 161*c*, 162*c*, 163*c*, and 164*c*, the fluid flow paths 161*a*, 162*a*, 163*a*, and 164*a*, and the outlet pipes 161*d*, 162*d*, 163*d*, and 164*d* in this order, and circulate. Accordingly, the temperature of each of the body 111, the top plate 112, the bottom plate 114, and the heater support 152 is adjusted. For example, water or fluorinated fluid such as Galden (registered trademark) may be used as a temperature-controlled fluid.

The rotation driving device 20 includes the rotary table 21, a housing box 22, the rotary shaft 23, a revolution motor 24, and an outer cylinder 25.

The rotary table 21 is provided in the vacuum chamber 11 and has a center of rotation at the center of the vacuum chamber 11. The rotary table 21 has a disc shape and is made of quartz, for example. A plurality of (for example, five) stages 211 are provided on the upper surface of the rotary table 21 along the rotational direction (the circumferential direction). The rotary table 21 is connected to the housing box 22 through a connector 214 (see FIG. 3).

A stage 211 has a disc shape slightly larger than the substrate W and is made of, for example, quartz. The substrate W is placed on the stage 211. The stage 211 is connected to a rotation motor 213 through a rotating shaft 212 and, is configured to be rotatable with respect to the rotary table 21 (see FIG. 1).

The rotating shaft 212 connects the lower surface of the stage 211 to the rotation motor 213 housed in the housing box 22, and transmits power of the rotation motor 213 to the stage 211. The rotating shaft 212 is configured to rotate with the center of the stage 211 as a center of rotation. The rotating shaft 212 passes through a ceiling 222 of the housing box 22 and passes through the rotary table 21. A seal 263 is provided in a through-hole of the ceiling 222 of the housing box 22 to maintain the airtight condition inside the housing box 22. The seal 263 includes, for example, a magnetic fluid seal.

The rotation motor 213 rotates the substrate W around the center of the substrate W by rotating the stage 211 through the rotating shaft 212 with respect to the rotary table 21. For example, the rotation motor 213 is preferably a servomotor.

The connector 214 connects, for example, the lower surface of the rotary table 21 to the upper surface of the housing box 22 (see FIG. 3). A plurality of connectors 214 are provided, for example, along the circumferential direction of the rotary table 21.

The housing box 22 is provided under the rotary table 21 in the vacuum chamber 11. The housing box 22 is connected to the rotary table 21 through the connector 214, and is configured to rotate integrally with the rotary table 21. The housing box 22 may be configured to move up and down in the vacuum chamber 11 via a lifting mechanism (not illustrated). The housing box 22 has a body 221 and the ceiling 222.

The body 221 is formed in a U-shape in a vertical cross-sectional view, and is formed in a ring shape along the rotational direction of the rotary table 21 (see FIG. 1).

The ceiling 222 is provided on the upper surface of the body 221 so as to cover an opening of the body 221. With this configuration, the body 221 and the ceiling 222 form a rotary housing 223 isolated in the vacuum chamber 11.

The rotary housing 223 is formed in a rectangular shape in the vertical cross-sectional view, and is formed in a ring shape along the rotational direction of the rotary table 21. The rotary housing 223 houses the rotation motor 213 (a rotation source). A communication path 224 that communicates the rotary housing 223 to the outside of the film deposition apparatus 1 is formed in the body 221. This causes the atmospheric air to be Introduced into the rotary housing 223 from the outside of the film deposition apparatus 1, and the inside of the rotary housing 223 is cooled down and maintained at atmospheric pressure. In order to rotatably dispose the rotary housing 223, the vacuum chamber 11 has a rotation source housing space 19 surrounded by the side wall body 113, the bottom plate 114, and the heater 15.

The rotary shaft 23 is fixed to the bottom of the housing box 22. The rotary shaft 23 is provided so as to pass through the bottom plate 114 of the vacuum chamber 11. The rotary shaft 23 transmits the power of the revolution motor 24 to the rotary table 21 and the housing box 22 to integrally rotate the rotary table 21 and the housing box 22. A seal 154 is provided between the outer wall of the fixing shaft 151 and the inner wall of the rotary shaft 23 of the rotation driving device 20. Accordingly, the rotary shaft 23 rotates relative to the fixing shaft 151 while maintaining the airtight condition inside the vacuum chamber 11. The seal 154 includes, for example, a magnetic fluid seal.

The outer cylinder 25 of the rotation driving device 20 is coupled to a center portion of the bottom surface of the bottom plate 114 of the vacuum chamber 11. The outer cylinder 25 supports the vacuum chamber 11 together with the fixing shaft 151 of the vacuum chamber 11. The seal 116 is provided between the rotary shaft 23 and the outer cylinder 25 so as to maintain the airtight condition inside the vacuum chamber 11. The seal 116 includes, for example, a magnetic fluid seal.

A path 231 is formed inside the rotary shaft 23. The path 231 is connected to the communication path 224 of the housing box 22, and functions as a fluid flow path for introducing atmospheric air into the housing box 22. The path 231 also functions as a wiring duct for introducing a power line and a signal line to drive the rotation motor 213 in the housing box 22. For example, the number of paths 231 that are provided may be the same as the number of rotation motors 213.

The controller 90 controls each unit of the film deposition apparatus 1. The controller 90 may be, for example, a computer. Further, a computer program that performs an operation of each unit of the film deposition apparatus 1 is stored in a storage medium. The storage medium may be, for example, a flexible disk, a compact disc, a hard disk, a flash memory, a DVD, or the like.

[Lift Pin Mechanism 30]

Next, a lift pin mechanism 30 of the film deposition apparatus 1 will be described. As illustrated in FIG. 1, when the transfer arm 14a loads and unloads the substrate W to and from the stage 211, the lift pin mechanism 30 raises and lowers a plurality of (in the present embodiment, three) lift pins 31 such that the substrate W is transferred from and to the transfer arm 14a. The film deposition apparatus 1 includes lift pin mechanisms 30 for respective (five) stages 211 provided on the rotary table 21. The lift pin mechanisms 30 are disposed at equal intervals along the circumferential direction of the rotary table 21. Each of the lift pin mechanisms 30 includes (three) upper lifting portions 40 and one lower operating portion 50 in the vacuum chamber 11. The three upper lifting portions 40 include the respective lift pins 31, and the lower operating portion 50 raises and lowers the lift pins 31 at the same time.

The upper lifting portions 40 are provided in the heater 15 of the vacuum chamber 11. The upper lifting portions 40 are provided so as to pass through the heater support 152 and the heater 153, and also accommodate the lift pins 31 such that the lift pins 31 can be displaced. The lower operating portion 50 is attached to the bottom surface of the bottom plate 114 of the vacuum chamber 11. The lower operating portion 50 includes a plurality of (three) plungers 51 that are displaced in the vertical direction so as to press the lower ends of the lift pins 31. That is, a lift pin mechanism 30 has a two-stage structure including, as operating members, the plurality of lift pins 31, which directly contact the substrate W, and the plurality of plungers 51, which indirectly raise and lower the substrate W through the lift pins 31. In the two-stage structure, the plurality of lift pins 31 and the plurality of plungers 51 are vertically separated.

A plurality of (five) lower operating portions 50 are provided at equal intervals along the circumferential direction of the bottom plate 114, and are disposed facing the respective stages 211. A lower operating portion 50 includes a housing 52 and a plunger driver 53 in addition to the plungers 51. Further, the plunger driver 53 includes a drive source 54, a drive transmitting unit 55 that transmits the operating force of the drive source 54, and a movable body 56 that supports the plungers 51 and that is displaced within the housing 52 by the drive transmitting unit 55.

The housing 52 is disposed on the outer side of the outer cylinder 25, is suspended from the bottom plate 114, and is formed in an appropriate shape (a substantially cylindrical shape) that can house each unit of the lower operating portion 50. The housing 52 is firmly secured to the bottom plate 114 by any suitable securing method such as a screw or engagement. The length in the vertical direction of the housing 52 corresponds to the total length of each of the plungers 51, and is set to be greater than, for example, the length in the vertical direction of the side wall body 113 of the vacuum chamber 11.

The drive source 54 is provided at a lower end portion of the housing 52. The drive source 54 operates as controlled by the controller 90, and transmits its operating force to the drive transmitting unit 55. The type of the drive source 54 is not particularly limited, and for example, a motor, a hydraulic or pneumatic cylinder mechanism, a magnetic mechanism, or the like may be applied to the drive source 54. The drive transmitting unit 55 raises and lowers the movable body 56 in the vertical direction by slowing down or converting the operating force of the drive source 54 as appropriate. The drive transmitting unit 55 is not particularly limited, and a structure in which a gear, a pulley, a rail, a ball screw, and the like are combined can be applied to the drive transmitting unit 55.

The movable body 56 extends radially outward (in the horizontal direction) from the drive transmitting unit 55, which is located at the center of the housing 52, and supports the lower ends of the plungers 51. The movable body 56 is raised and lowered by the drive transmitting unit 55 in the vertical direction, thereby causing the plungers 51 to be displaced integrally.

Each of the plungers 51 is formed in an elongated and solid rod shape, is fixed to the movable body 56, and extends parallel to the vertical direction. The bottom plate 114 has bottom-plate-side through-holes 114a at positions facing the plungers 51 such that the plungers 51 pass through the bottom-plate-side through-holes 114a. Further, the housing box 22 has a box-side through-hole 225 at a position near the rotary shaft 23 and facing a corresponding plunger 51 such that the corresponding plunger 51 passes through the box-side through-hole 225.

Figure 4:
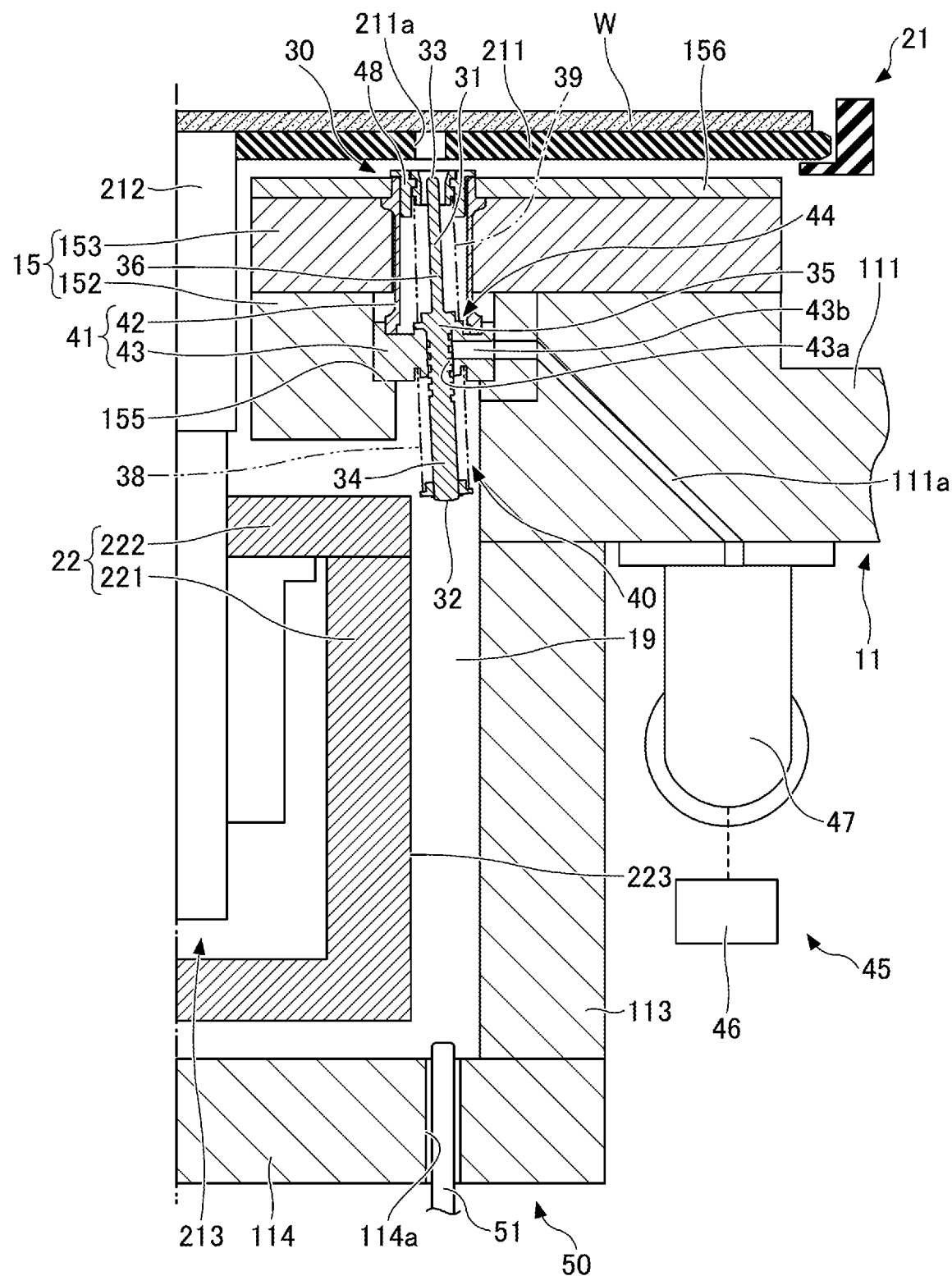
FIG. 4 is a partially enlarged cross-sectional view of the vicinity of the installation position of a lift pin mechanism of FIG. 1.

FIG. 4 is a partially enlarged cross-sectional view of the vicinity of the installation position of the lift pin mechanism 30 of FIG. 1. As illustrated in FIG. 4, when a lift pin 31 is in a non-operation state, a plunger 51 waits in a state in which the upper end of the plunger 51 slightly protrudes from a bottom-plate-side through-hole 114a. Then, when the substrate W is transferred, the plunger 51 is raised together with the movable body 56 and is moved within the rotation source housing space 19. The plunger 51 is moved alongside the housing box 22 or passes through the box-side through-hole 225, contacts the lift pin 31 of each of the upper lifting portions 40, and pushes up the lift pin 31.

As described above, each of the upper lifting portions 40 of the lift pin mechanism 30 is fixed at a position (the heater 15) spaced apart from the lower operating portion 50 in the vertical direction, and includes the lift pin 31 configured to be raised and lowered by the plunger 51. Further, each of the upper lifting portions 40 includes a housing 41 that houses the lift pin 31 in a raisable and lowerable manner, a gas supply 45 that can supply a gas through the housing 41, and a cylindrical member 48 disposed at an upper end portion of the housing 41 and displaceable simultaneously with the lift pin 31.

The plurality of (three) upper lifting portions 40 are provided at the sides of the rotating shaft 212, and disposed along the circumferential direction of the stage 211. The stage 211 includes a plurality of (three) through-holes 211a through which lift pins 31 can pass (see FIG. 2 as well) at positions facing the upper lifting portions 40. The through-holes 211a are provided at equal intervals along the circumferential direction of the stage 211, at positions a predetermined radial distance away from the center of the stage 211.

Figure 5:
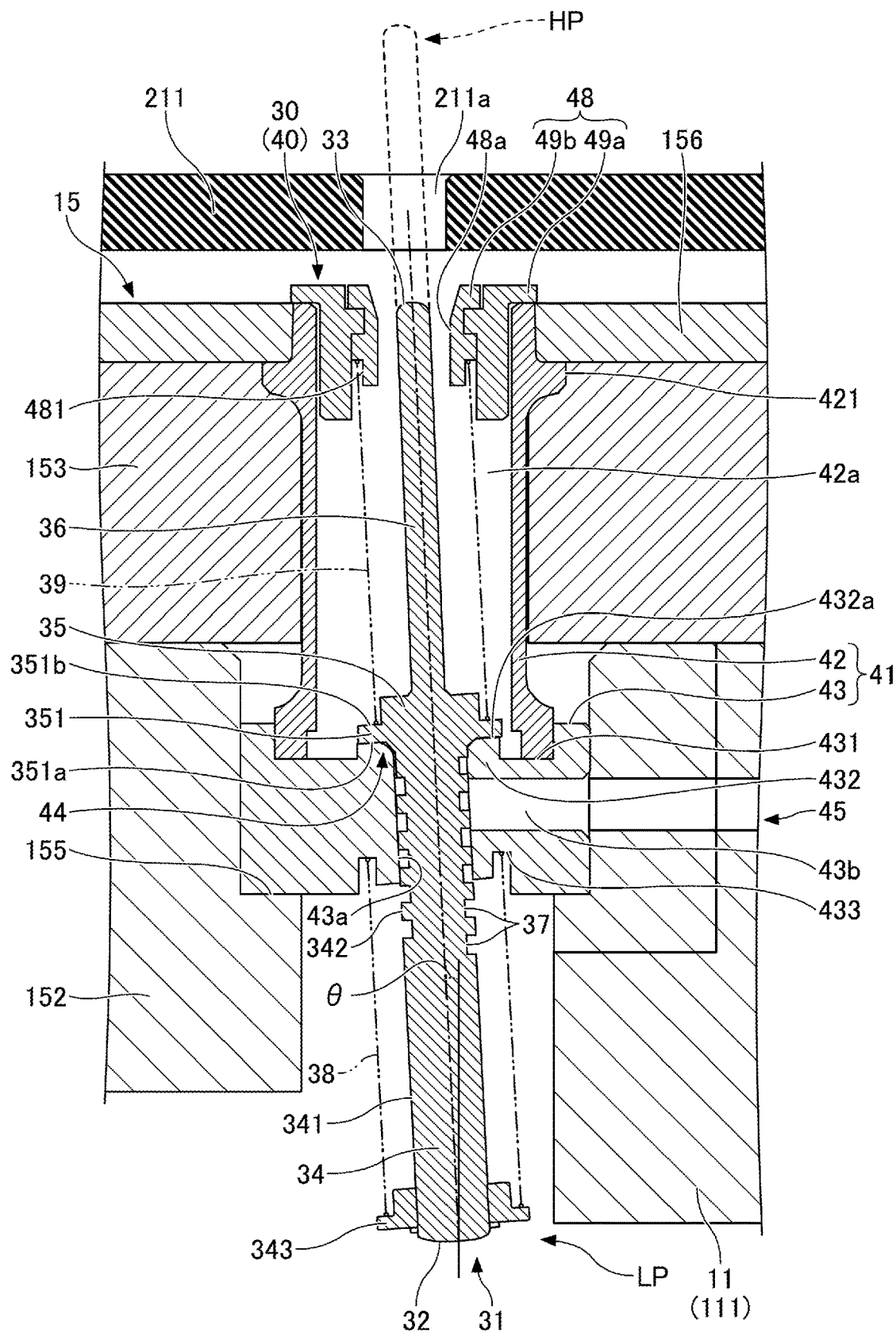
FIG. 5 is a partially enlarged cross-sectional view of an upper lifting portion of FIG. 1.

FIG. 5 is a partially enlarged cross-sectional view of an upper lifting portion 40 of FIG. 1. As illustrated in FIG. 5, a lift pin 31 is a member having a cylindrical shape (a solid rod shape), and is longer than the combined thickness of the heater support 152 and the heater 153. The lift pin 31 is disposed in the housing 41, and is displaceable between a lowered position LP, where a lower end surface 32 protrudes below the lower surface of the heater support 152, and a raised position HP where an upper end surface 33 protrudes above the upper surface of the stage 211.

Further, in the present embodiment, the axis of the lift pin 31 is slightly inclined with respect to the axis of the plunger 51, that is, the vertical direction of the film deposition apparatus 1. The lift pin 31 is inclined such that the upper end of the lift pin 31 is located towards the rotary shaft 23 (revolving shaft) of the rotary table 21. Further, the axes of lift pins 31 provided for one stage 211 are parallel to each other. The inclination angle θ of the lift pin 31 with respect to the vertical direction is preferably set to be in the range of, for example, 1° to 5°. In the present embodiment, the inclination angle θ of the lift pin 31 with respect to the vertical direction is 2.5°. Note that the lift pin 31 may be disposed parallel to the vertical direction.

More specifically, the lift pin 31 includes a lower rod portion 34, a flange forming portion 35, and an upper rod portion 36 in this order from the bottom to the top. The lower rod portion 34, the flange forming portion 35, and the upper rod portion 36 are integrally formed together. The lift pin 31 is preferably formed of a material, such as a metal material or a ceramic, having high abrasion resistance, and in the present embodiment, is formed of alumina ($Al_2O_3$).

The lower end surface 32 of the lift pin 31 is formed in a circular arc shape in a vertical cross-sectional view. The lower end surface 32 of the lift pin 31 that is being inclined can make point contact with the upper end (flat surface) of the plunger 51. Therefore, the lift pin 31 can stably receive the upward pushing force of the plunger 51 while reducing friction with the plunger 51.

The lower rod portion 34 constitutes a portion that continues with the lower end surface 32 and that receives the upward pushing force of the plunger 51 at a position below the flange forming portion 35. The outer diameter of the lower rod portion 34 is set to be approximately the same as or smaller than the outer diameter of the plunger 51.

The outer circumferential surface of the lower rod portion 34 includes a smooth surface 341 having no unevenness in the range from the lower end surface 32 to the intermediate portion of the lower rod portion 34, and an uneven surface 342 having a spiral groove 37 in the range from the intermediate portion of the lower rod portion 34 to the flange forming portion 35. The spiral groove 37 serves as a flow path through which a gas supplied from the gas supply 45 flows. Note that the groove 37 provided in the lift pin 31 is not limited to having a spiral shape. For example, the groove 37 may have a linear shape parallel to the axis of the lift pin 31.

A washer 343 is attached to the smooth surface 341 of the lift pin 31, and is located near the lower end of the lower rod portion 34. The washer 343 has a ring shape and is supported by a washer (not illustrated). The upper surface of the washer 343 is formed in a stepped shape, and the lower end of a lower coil spring 38 contacts an outer stepped surface of the washer 343. The upper end of the lower coil spring 38 is housed in the housing 41. Accordingly, the lower coil spring 38 can resiliently press the lift pin 31, to which the washer 343 is attached, downward.

The flange forming portion 35 is provided at a substantially intermediate position in the axial direction of the lift pin 31. The flange forming portion 35 includes a flange body 351. The flange body 351 is formed in a ring shape and protrudes radially outward from a center portion, which continues from the lower rod portion 34 and the upper rod portion 36, of the lift pin 31. The flange body 351 protrudes outward such that the outer diameter of the flange body 351 is substantially the same as the outer diameter of the washer 343 attached to the lower rod portion 34.

A lower surface 351a of the flange body 351 is a flat surface that can make surface contact with the housing 41 in a state in which the lift pin 31 is in the lowering position LP. The lower surface 351a is oriented perpendicular to the axis of the lift pin 31. As described above, the lift pin 31 is inclined within the housing 41, and thus, the lower surface 351a is inclined with respect to the horizontal plane (horizontal direction) so as to be lowered toward the rotary shaft 23 of the rotary table 21.

An upper surface 351b of the flange body 351 is formed in a stepped shape, and the lower end of an upper coil spring 39 (an elastic member) contacts an outer stepped surface of the upper surface 351b. The upper end of the upper coil spring 39 is housed in the cylindrical member 48. Accordingly, the cylindrical member 48 is resiliently supported by the upper coil spring 39.

The upper rod portion 36 of the lift pin 31 constitutes a portion that supports the substrate W at a position above the flange forming portion 35. The upper rod portion 36 has a smooth outer circumferential surface having a constant outer diameter, and is thinner than the lower rod portion 34. The upper end surface 33, which continues with the upper rod portion 36, of the lift pin 31 is formed in a substantially hemispherical shape and can make point contact with the substrate W.

The upper rod portion 36 is located below the stage 211 in a state in which the lift pin 31 is in the lowered position LP, thereby allowing the stage 211 to revolve and rotate. Upon the lift pin 31 being raised in a state in which the stage 211 stops revolving and rotating, the upper rod portion 36 passes through a corresponding through-hole 211a of the stage 211 and is exposed above the upper surface of the stage 211.

The housing 41, which houses the lift pin 31, of the upper lifting portion 40, includes a housing bracket 42 and a support bracket 43. The housing bracket 42 passes through the heater 153, and the support bracket 43 supports the lower end of the housing bracket 42 and is fixed to the heater support 152.

The housing bracket 42 is formed in a cylindrical shape having a housing space 42a in which the lift pin 31 can be housed. The upper end of the housing bracket 42 is approximately coplanar with the upper surface of the shielding plate 156 provided on the heater 153. The lower end of the housing bracket 42 extends below the heater 153 and is inserted into the support bracket 43. A fitting projection 421 is provided on the outer peripheral surface of the housing bracket 42 such that the housing bracket 42 is fitted to the shielding plate 156.

The housing bracket 42 is located away from and radially outward relative to the lift pin 31 housed in the housing space 42a, and does not contact the lift pin 31 when the lift pin 31 is raised and lowered. The axis of the housing bracket 42 is parallel to the vertical direction. Accordingly, in the upper lifting portion 40, only the lift pin 31 is inclined with respect to the housing 41.

The support bracket 43 is accommodated in in a recessed space 155 formed in the heater support 152, and supports the housing bracket 42. The support bracket 43 is formed in a block shape having an outer diameter larger than the housing bracket 42 and extending outward relative to the housing bracket 42. A fitting recess 431 having a ring shape is provided in the upper surface of the support bracket 43, and the lower end of the housing bracket 42 can be fitted into the fitting recess 431.

Further, the support bracket 43 has a placement hole 43a in which the lower rod portion 34 of the lift pin 31 is disposed. The placement hole 43a has a constant inner diameter, and the axis of the placement hole 43a is inclined with respect to the vertical direction. That is, the lower rod portion 34 contacts the inner surface of the placement hole 43a of the support bracket 43, and the lift pin 31 can be thus raised and lowered while being inclined.

A flange seat 432 is formed between the fitting recess 431 and the placement hole 43a. The flange seat 432 slightly projects upward with respect to the bottom surface of the fitting recess 431. An end surface 432a of the flange seat 432 can make surface contact with the lower surface 351a of the flange body 351. In the present embodiment, the end surface 432a is inclined so as to be gradually lowered toward the rotary shaft 23 in accordance with the inclination of the lower surface 351a of the flange body 351. Accordingly, the end surface 432a can come into contact with the lower surface 351a of the flange body 351 without any gaps. That is, the flange body 351 of the lift pin 31 and the support bracket 43 of the housing 41 form a closing structure 44 that closes a gap between the lift pin 31 and the housing 41 during a film deposition process for the substrate W in which the lift pin 31 is in the lowered position LP.

Further, the support bracket 43 has a gas communication hole 43b for communication between the outer surface of the support bracket 43 with the placement hole 43a. The gas communication hole 43b extends in the horizontal direction, and constitutes a part of the gas supply 45 that causes a gas to flow toward the placement hole 43a. Further, a spring seat 433 that accommodates the upper end of the lower coil spring 38 is formed at the lower surface of the support bracket 43 and around the placement hole 43a.

The gas supply 45 restricts a gas from flowing below the upper lifting portion 40 (toward the housing box 22) by supplying the gas into the housing 41 when the lift pin 31 is raised and lowered. Examples of the gas supplied by the gas supply 45 include an inert gas such as argon gas, nitrogen gas, and dry air.

Specifically, the gas supply 45 includes a gas source 46 provided outside the vacuum chamber 11, a connection pipe 47 connected to the vacuum chamber 11, and a gas passage 111a provided in the vacuum chamber 11. Further, the connection pipe 47 includes an opening/closing valve (not illustrated) for opening/closing the flow path of the connection pipe 47, a mass flow controller (not illustrated) for controlling the flow rate of the gas, and the like as controlled by the controller 90. The gas passage 111a is provided in the body 111 and the heater support 152, and is in communication with the gas communication hole 43b provided in the support bracket 43. When the lift pin 31 is raised and lowered, an inert gas, flowing from the gas passage 111a, passes through the spiral groove 37 of the lift pin 31 into the housing space 42a of the housing 41.

Further, the cylindrical member 48 of the upper lifting portion 40 has a hole 48a in which the upper rod portion 36 of the lift pin 31 is disposed. The hole 48a has a cylindrical shape and is formed in the upper portion of and inside the housing 41. For example, the cylindrical member 48 includes an outer cylindrical portion 49a that can be caught on the upper end of the housing 41, and an inner cylindrical portion 49b that is disposed on the inner side of the outer cylindrical portion 49a. A spring seat 481 that accommodates the upper coil spring 39 is formed between the outer cylindrical portion 49a and the inner cylindrical portion 49b.

The cylindrical member 48 can be moved relative to the housing 41. When the lift pin 31 is raised, the cylindrical member 48 is pushed up through the upper coil spring 39 and is thus raised together with the lift pin 31. The cylindrical member 48 contacts the lower surface of the stage 211 as the lift pin 31 is raised, thereby causing the through-hole 211a of the stage 211 to communicate with the housing space 42a of the housing 41 through the hole 48a. Upon the cylindrical member 48 contacting the stage 211, while the raising of the cylindrical member 48 stops, the lift pin 31 continues to be raised relative to the cylindrical member 48. Accordingly, the lift pin 31 can be stably inserted into the through-hole 211a.

[Operation of Film Deposition Apparatus 1]

The substrate processing apparatus (film deposition apparatus 1) according to the present embodiment is basically configured as described above, and its effects will be described below. In the following, an example in which the film deposition apparatus 1 forms a film on a substrate W on each stage 211 by using atomic layer deposition (ALD) will be described.

As illustrated in FIG. 1 through FIG. 3, the controller 90 of the film deposition apparatus 1 controls the revolution motor 24 to rotate the rotary table 21. This causes a substrate W on a stage 211 provided along the circumferential direction of the rotary table 21 to revolve. The rotational speed of the rotary table 21 may be in the range of, for example, 1 rpm to 500 rpm.

Further, the controller 90 controls the rotation motor 213 to rotate the stage 211 relative to the rotary table 21. As a result, the substrate W placed on the stage 211 rotates. The rotational speed of the stage 211 may be in the range of, for example, 1 to 30 rpm.

The controller 90 controls the processor 10 and performs a film deposition process on the substrate W while the stage 211 is revolving and rotating. The controller 90, for example, supplies the source gas into the source gas adsorption region P1 from the source gas nozzle 121 and supplies the reaction gas into the reaction gas supply region P2 from the reaction gas nozzle 122, in a state in which the separation gas is supplied from the separation gas nozzles 123 and 124 into the separation region D. Accordingly, when the substrate W placed on the stage 211 repeatedly passes through the source gas adsorption region P1 and the reaction gas supply region P2, a film formed by ALD is deposited on the surface of the substrate W.

As illustrated in FIG. 5, during the film deposition process in which the lift pin 31 is in the lowered position LP, the closing structure 44 is formed by the lift pin 31 and the housing 41 of the upper lifting portion 40 of the lift pin mechanism 30. That is, the lower surface 351a of the flange body 351 makes surface contact with the end surface 432a of the flange seat 432, thereby closing the gap between the lift pin 31 and the housing 41. Accordingly, the processing gas (the source gas and the reaction gas) can be prevented from flowing through the gap into the rotation source housing space 19 (see FIG. 4 as well). As a result, changes in gas pressure (breathing or pulsation) due to the processing gas flowing into the rotation source housing space 19 during the film deposition process can be effectively reduced. In addition, because the closing structure 44 blocks the flow of the processing gas into the rotation source housing space 19, corrosion of each constituent element (such as the rotary housing 223) can be suppressed.

Further, when the lift pin 31 is in the lowered position LP, the uneven surface 342 having the spiral groove 37 of the lift pin 31 faces the inner surface of the placement hole 43a of the support bracket 43. Accordingly, the area of the lift pin 31 that contacts the support bracket 43 is reduced, and thus, the lift pin 31 can have high heat and corrosion resistance.

Before the film deposition process and after the film deposition process, the controller 90 operates the lift pin mechanism 30 to transfer the substrate W from and to the transfer arm 14a. At this time, the controller 90 stops the rotation motor 213 and the revolution motor 24 such that the stage 211 stops revolving and rotating. When stopping the motors, the controller 90 monitors the rotation position (rotation angle) of the rotary table 21 and the rotation position (rotation angles) of the stage 211, such that the through-hole 211a of the stage 211 faces the lift pin 31 that waits in the lowered position LP. A method for monitoring the rotation positions is not particularly limited. For example, sensors (not illustrated) configured to detect the position of the rotary table 21 and the position of the stage 211 may be provided, and the controller 90 may stop the rotation motor 213 and the revolution motor 24 based on detection signals of the sensors. Alternatively, the film deposition apparatus 1 may use a motor, such as a stepper motor, capable of controlling the rotation angle of each of the rotation motor 213 and the revolution motor 24 to adjust the rotation position of the stage 211.

As illustrated in FIG. 1 and FIG. 4, after the stage 211 stops rotating, the controller 90 controls the lower operating portion 50 to raise the plunger 51. As a result, the plunger 51 moves up in the space inside the side wall body 113 and contacts the lower end surface 32 of the lift pin 31 that protrudes from the lower surface of the heater support 152. By further pushing up the plunger 51, the controller 90 raises the lift pin 31 while causing the lower coil spring 38 to contract. At this time, the lift pin 31 is guided by the placement hole 43a of the support bracket 43 such that the lift pin 31 is raised while the upper end portion of the lift pin 31 is inclined toward the rotary shaft 23.

Figure 6A:
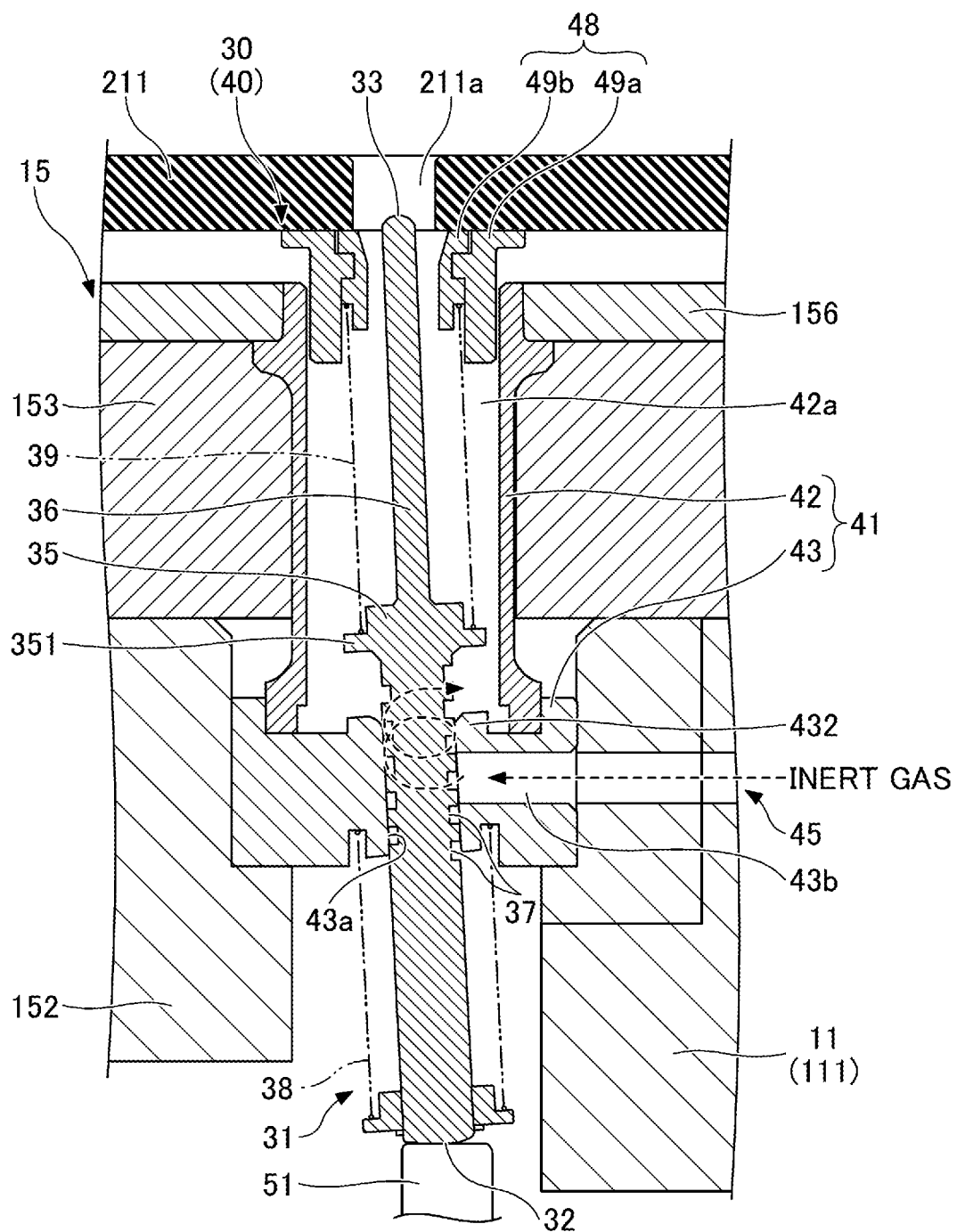
FIGS. 6A and 6B are partial cross-sectional views illustrating an operation of when a lift pin of FIG. 1 is raised.
Figure 6B:
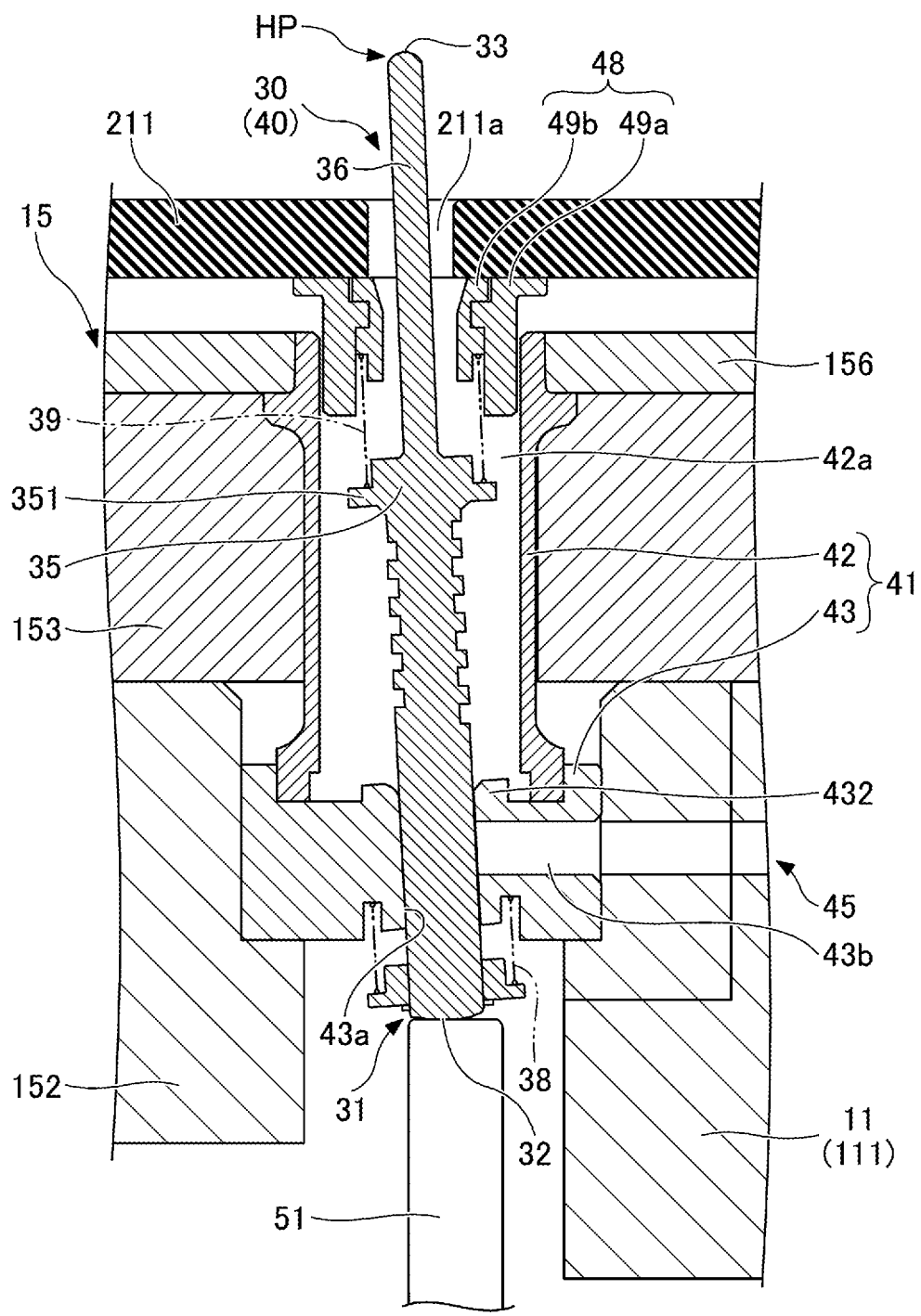

FIGS. 6A and 6B are partial cross-sectional views illustrating an operation when the lift pin 31 of FIG. 1 is raised. FIG. 6A illustrates a state after the lift pin 31 starts to be raised. FIG. 6B illustrates a state when the lift pin 31 is moved to the raised position HP. As illustrated in FIG. 6A, when raising the lift pin 31, the controller 90 operates the gas supply 45 to supply the inert gas from the gas source 46 into the housing 41. After passing through the gas passage 111a of the vacuum chamber 11, the inert gas flows into the placement hole 43a through the gas communication hole 43b of the support bracket 43. The inert gas can facilitate the smooth movement of the lift pin 31. Thus, the lift pin 31 can be stably raised, and generation of particles can be suppressed.

The inert gas that has flowed into the placement hole 43a flows along the spiral groove 37 of the lift pin 31. In a state in which the flange body 351 of the lift pin 31 is moved up from the support bracket 43, the inert gas flows into the housing space 42a through the spiral groove 37. Accordingly, the processing gas remaining above the stage 211 can be prevented from flowing into the rotation source housing space 19 through the housing space 42a. As a result, the lift pin mechanism 30 can suppress corrosion of constituent elements located below the upper lifting portion 40. Further, the inside of the entire vacuum chamber 11 can be maintained at the same pressure by the inert gas flowing into a space above the heater 15 and a space below the heater 15 through the housing 41. Accordingly, the film deposition apparatus 1 can prevent scattering of particles by suppressing the movement of the gas due to uneven pressure.

Figure 7A:
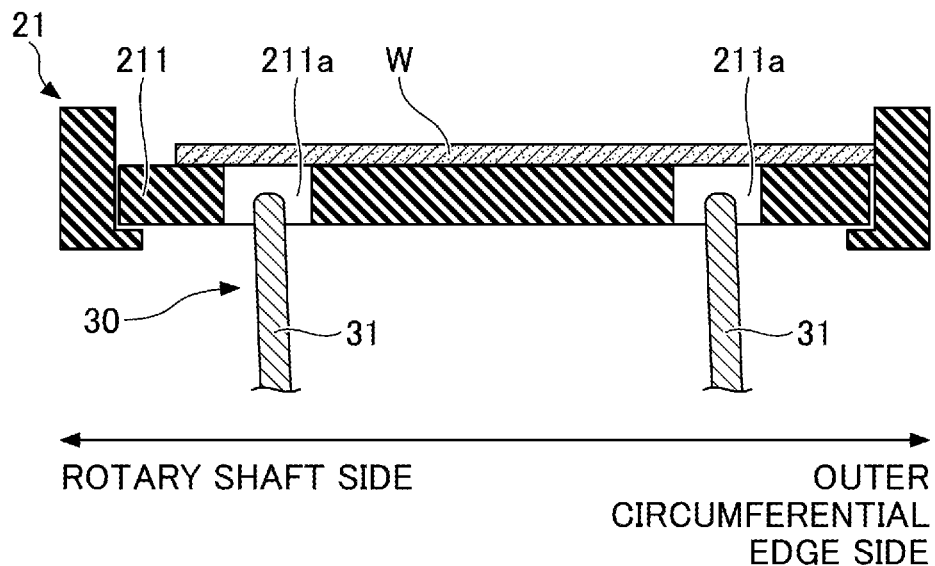
FIGS. 7A through 7C are schematic diagrams illustrating an example of a substrate raised by the lift pin of FIG. 1.
Figure 7B:
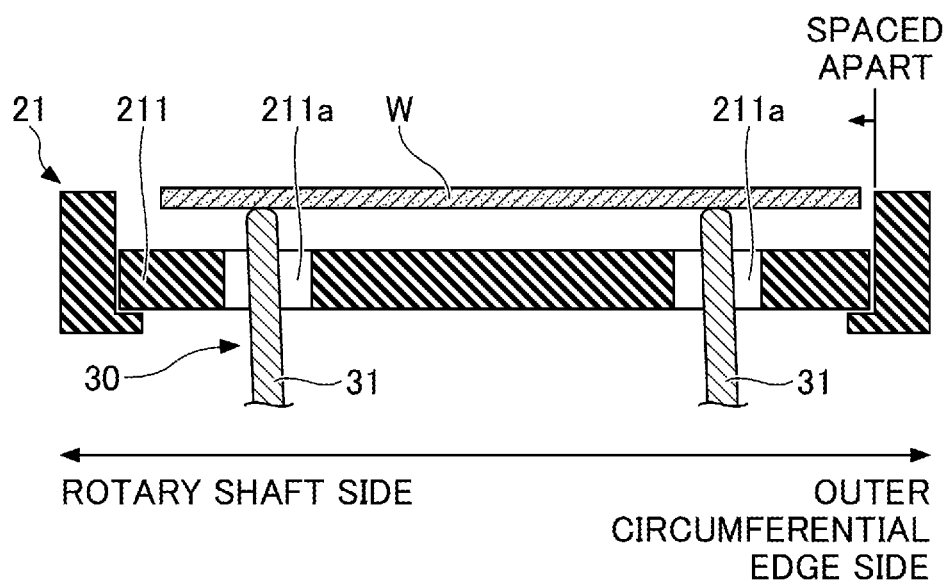
Figure 7C:
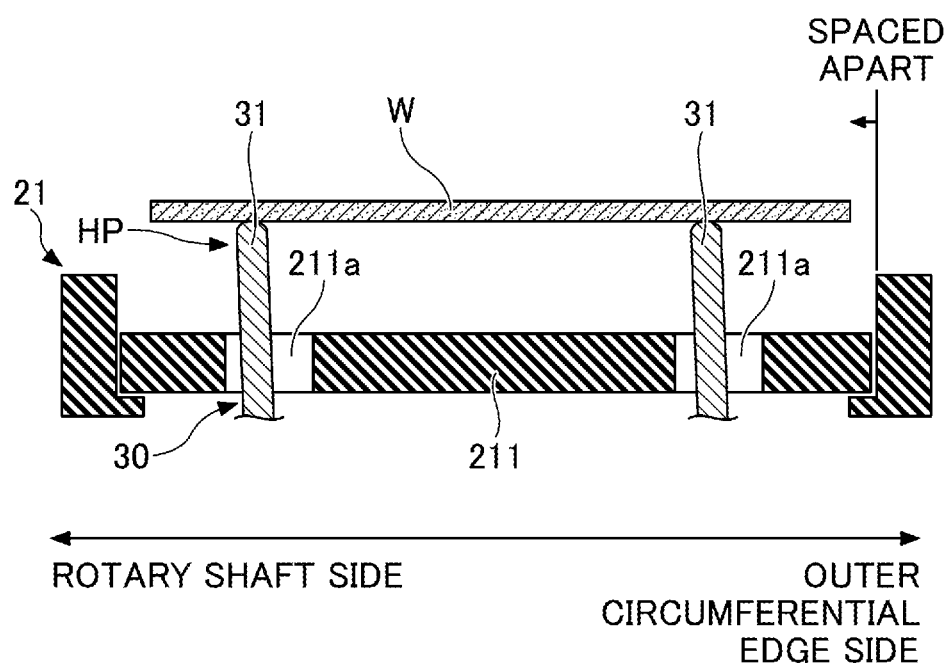

FIGS. 7A through 7C are schematic diagrams illustrating an example of the substrate W raised by the lift pin 31 of FIG. 1. FIG. 7A illustrates a state before the lift pin 31 contacts the substrate W. FIG. 7B illustrates a state in which the substrate W is raised by the lift pin 31. FIG. 7C illustrates a state in which the lift pin 31 has reached the raised position HP. As illustrated in FIGS. 7A through 7C, the lift pin 31 continues to be raised after contacting the substrate W, and thus, the substrate W can be raised from the stage 211 and can be transferred to the transfer arm 14a. The lift pin 31 is raised obliquely toward the rotary shaft 23, and thus, the substrate W can be spaced apart from the outer circumferential edge of the rotary table 21. There would be a possibility that the substrate W placed on the stage 211 would be moved to the outer circumferential edge of the rotary table 21 due to centrifugal force generated by rotation of the rotary table 21. If the substrate W is moved to the outer circumferential edge of the rotary table 21 and is raised in the vertical direction in this state, particles would be generated due to friction between the substrate W and the outer circumferential edge of the rotary table 21.

According to the present embodiment, the lift pin mechanism 30 can raise the lift pin 31 in an inclined state, thereby allowing the substrate W to be raised while being spaced apart from the outer circumferential edge of the rotary table 21. Accordingly, generation of particles can be suppressed. For example, if the lift pin 31 is inclined at an inclination angle θ of 1° to 5° with respect to the vertical direction, the substrate W can be moved toward the rotary shaft 23 by approximately 0.5 mm to 3 mm in the horizontal direction while the lift pin 31 reaches the raised position HP from a position where the lift pin 31 contacts the substrate W.

Further, the lift pin mechanism 30 can lower the lift pin 31 in an inclined state when placing the substrate W on the stage 211, thereby avoiding a situation in which the substrate W is lowered in contact with the outer circumferential edge of the rotary table 21. Accordingly, generation of particles can be suppressed. Note that the film deposition apparatus 1 does not necessarily have a configuration in which the substrate W is placed in a space defined by the upper surface of the stage 211 and the inner circumferential surface of the rotary table 21, and the stage 211 itself may have a recess (not illustrated) in which the substrate W can be accommodated. In this case as well, the lift pin mechanism 30 can avoid friction between the inner peripheral surface of the recess and the substrate W by raising the lift pin 31 while inclining the lift pin 31 toward the rotary shaft 23.

Note that the film deposition apparatus 1 is not limited to the above-described embodiment, and may be modified in a variety of manners. For example, the lift pin 31 does not necessarily include the flange body 351 at an intermediate position in the axial direction, and the flange body 351 may be provided near the lower end surface 32 with which the plunger 51 makes contact. Further, for example, the upper lifting portion 40 may have a configuration in which the entire lift pin 31 is housed in the housing 41, and the plunger 51 enters the housing 41 and raises the lift pin 31. Further, the lift pin mechanism 30 may have a configuration in which the lift pin 31 is directly raised and lowered by a driving part (not illustrated) provided in the heater support 152 without using the plunger 51.

The technical concept and advantages of the present disclosure described in the above embodiment will be described below.

According to an aspect of the present invention, a substrate processing apparatus (film deposition apparatus 1) includes a processing chamber (vacuum chamber 11) configured to process a substrate W by using a processing gas; a rotary table 21 that is rotatably provided in the processing chamber; a stage 211 on which the substrate W is to be placed and that is configured to be rotatable relative to the rotary table 21 at a position spaced apart from a center of rotation of the rotary table 21; a lift pin 31 configured to be displaced relative to the stage 211 to raise and lower the substrate W; and a housing 41 configured to house the lift pin 31 when the lift pin 31 is not exposed from the stage 211. The lift pin 31 and the housing 41 have a closing structure 44 that closes a gap between the lift pin 31 and the housing 41.

According to the above, in the substrate processing apparatus (film deposition apparatus 1), the closing structure 44 closes the gap between the lift pin 31 and the housing 41. Therefore, when the substrate W is processed by using the processing gas, the processing gas on the substrate W side can be prevented from flowing below the housing 41 through the gap. Accordingly, the substrate processing apparatus can appropriately adjust the pressure of the processing chamber (vacuum chamber 11) and can further stably process the substrate W.

The closing structure 44 includes a flange body 351 that protrudes radially outward from an outer peripheral surface of the lift pin 31, and a flange seat 432 disposed around a placement hole 43a in which the lift pin 31 is disposed in the housing 41. The flange seat 432 has an end surface 432a that makes surface contact with a lower surface 351a of the flange body 351. By including the flange body 351 and the flange seat 432, the closing structure 44 can more securely block the movement of the processing gas.

The placement hole 43a is inclined with respect to a vertical direction and guides the lift pin 31 such that the lift pin 31 is raised and lowered toward the center of rotation of the rotary table 21. Accordingly, when the lift pin 31 is raised and lowered, the substrate processing apparatus (film deposition apparatus 1) can avoid friction caused by the substrate contacting the outer circumferential edge of the rotary table 21, thereby suppressing generation of particles.

The lower surface 351a of the flange body 351 and the end surface 432a of the flange seat 432 are inclined with respect to a horizontal plane in accordance with an inclination of the lift pin 31. Accordingly, the substrate processing apparatus (film deposition apparatus 1) can cause the flange body 351 and the flange seat 432 to make sufficient surface contact with each other even when the lift pin 31 is inclined by the placement hole 43a.

The substrate processing apparatus (film deposition apparatus 1) further includes a gas supply 45 configured to supply a gas into the placement hole 43a when the lift pin 31 is raised and lowered. Accordingly, the substrate processing apparatus (film deposition apparatus 1) can have an effect of facilitating the smooth movement of the lift pin 31 by supplying the gas to the surroundings of the lift pin 31. As a result, the lift pin 31 can be more stably raised and lowered.

The outer peripheral surface of the lift pin 31 has a groove 37 at a position located below the flange body 351. The groove 37 is configured to cause the gas to flow. Accordingly, when the lift pin 31 is raised and lowered, the gas can flow above the flange seat 432, and thus, the remaining processing gas can be prevented from flowing below the housing 41. Therefore, corrosion of constituent elements located below the housing 41 due to the processing gas can be suppressed.

The flange body 351 is provided at an intermediate position in an axial direction of the lift pin 31. Accordingly, the substrate processing apparatus (film deposition apparatus 1) can block the processing gas at the intermediate position in the axial direction of the lift pin 31.

The substrate processing apparatus (film deposition apparatus 1) further includes an elastic member (upper coil spring 39) having a lower end that contacts an upper surface of the flange body 351, and a cylindrical member 48 that is supported by an upper end of the elastic member and is configured to contact the stage 211 as the lift pin 31 is raised. Accordingly, the substrate processing apparatus (film deposition apparatus 1) can further suppress the flow of the processing gas into the housing 41 by causing the cylindrical member 48 to contact the stage 211 when the lift pin 31 is raised.

The substrate processing apparatus (film deposition apparatus 1) further includes a plunger 51 that is a separate member from the lift pin 31 and configured to push the lift pin 31 upward, and a plunger driver 53 configured to raise and lower the plunger 51. Accordingly, the substrate processing apparatus (film deposition apparatus 1) can smoothly raise the lift pin 31 by causing the plunger 51 to push the lift pin 31.

The processing chamber (vacuum chamber 11) has a rotation source housing space 19 that houses a rotation source (rotation motor 213) and a rotary housing 223. The rotation source is configured to rotate the stage 211, and the rotary housing 223 is configured to house the rotation source and rotate integrally with the rotary table 21. The plunger 51 and the plunger driver 53 are disposed below the rotary housing 223, and the plunger driver 53 causes the plunger 51 to be raised through the rotation source housing space 19 to contact the lift pin 31. Accordingly, the substrate processing apparatus (film deposition apparatus 1) can stably rotate the rotation source and the rotary housing 223 integrally with the rotary table 21. In addition, when the lift pin 31 is raised and lowered, the plunger 51 can be moved to the lift pin 31, thus facilitating the operation of the lift pin 31.

According to an embodiment of the present disclosure, a substrate can be stably processed in a configuration that includes lift pins.

The substrate processing apparatus according to the embodiment disclosed herein should be considered to be exemplary in all respects and not restrictive. The above embodiments may be modified and enhanced in various forms without departing from the appended claims and spirit thereof. Matters described in the above embodiments may take on other configurations insofar as there are no contradictions, and may be combined insofar as there are no contradictions.

What is claimed is:

1. A substrate processing apparatus comprising:
 a processing chamber configured to process a substrate by using a processing gas;
 a rotary table that is rotatably provided in the processing chamber;
 a stage on which the substrate is to be placed and that is configured to be rotatable relative to the rotary table at a position spaced apart from a center of rotation of the rotary table;
 a lift pin configured to be displaced relative to the stage to raise and lower the substrate; and
 a housing configured to house the lift pin when the lift pin is not exposed from the stage,
 wherein the lift pin and the housing have a closing structure that closes a gap between the lift pin and the housing,
 wherein the closing structure includes a flange body that protrudes radially outward from an outer peripheral surface of the lift pin, and a flange seat disposed around a placement hole in which the lift pin is disposed in the housing, the flange seat having an end surface that makes surface contact with a lower surface of the flange body, and
 wherein the placement hole is inclined with respect to a vertical direction and guides the lift pin such that the lift pin is raised and lowered toward the center of rotation of the rotary table.

2. The substrate processing apparatus according to claim 1, wherein the lower surface of the flange body and the end surface of the flange seat are inclined with respect to a horizontal plane in accordance with an inclination of the lift pin.

3. The substrate processing apparatus according to claim 1, further comprising a gas supply configured to supply a gas into the placement hole when the lift pin is raised and lowered.

4. The substrate processing apparatus according to claim 3, wherein the outer peripheral surface of the lift pin has a groove at a position located below the flange body, the groove being configured to cause the gas to flow.

5. The substrate processing apparatus according to claim 1, wherein the flange body is provided at an intermediate position in an axial direction of the lift pin.

6. The substrate processing apparatus according to claim 5, further comprising
 an elastic member having a lower end that contacts an upper surface of the flange body; and
 a cylindrical member that is supported by an upper end of the elastic member and is configured to contact the stage as the lift pin is raised.

7. The substrate processing apparatus according to claim 1, further comprising
 a plunger that is a separate member from the lift pin and configured to push the lift pin upward; and
 a plunger driver configured to raise and lower the plunger.

8. The substrate processing apparatus according to claim 7, wherein the processing chamber has a rotation source housing space that houses a rotation source and a rotary housing, the rotation source being configured to rotate the stage, and the rotary housing being configured to house the rotation source and rotate integrally with the rotary table, and
 wherein the plunger and the plunger driver are disposed below the rotary housing, and the plunger driver causes the plunger to be raised through the rotation source housing space to contact the lift pin.

* * * * *